United States Patent [19]
Ford et al.

[11] Patent Number: 5,563,594
[45] Date of Patent: Oct. 8, 1996

[54] CIRCUIT AND METHOD OF TIMING DATA TRANSFERS

[75] Inventors: David K. Ford, Gilbert; Bernard E. Weir, III, Chandler, both of Ariz.

[73] Assignee: Motorola, Schaumburg, Ill.

[21] Appl. No.: 298,715

[22] Filed: Aug. 31, 1994

[51] Int. Cl.[6] .................................................. H03M 9/00
[52] U.S. Cl. ........................ 341/100; 341/101; 327/279
[58] Field of Search ................................ 341/100, 101; 326/93; 327/160, 175, 265, 279

[56] References Cited

U.S. PATENT DOCUMENTS

| | | | |
|---|---|---|---|
| 4,218,758 | 8/1980 | Allen et al. | 364/900 |
| 4,445,215 | 4/1984 | Svendsen | 370/279 |
| 4,815,107 | 3/1989 | Kishimoto et al. | 375/96 |
| 5,379,038 | 1/1995 | Matsumoto | 341/101 |

*Primary Examiner*—Marc S. Hoff
*Attorney, Agent, or Firm*—Robert D. Atkins

[57] ABSTRACT

A data conversion circuit receives input data from external sourcing logic and performs a parallel-serial conversion. Likewise, a data conversion circuit performs a serial-parallel conversion and presents output data to external sinking logic. In the parallel-serial conversion (10), the input data is translated (12) and stored in a register (14). A multiplexer (16) rotates through the data to provide the serial output. In the serial-parallel conversion (70), the input data is sequenced into a multiplexer (74) to achieve the parallel data word. The parallel data word is stored in a register (76) before presenting it to external logic. Phase delay logic (22) sets the delay of a transfer data control signal that requests data be read or written. Once the proper delay is determined by experimentation, the phase delay logic controls the phase of the transfer data control signal to request more data at the correct time, or present more data at the correct time, to allow maximum operating speed for the data converter.

19 Claims, 3 Drawing Sheets

CIRCUIT AND METHOD OF TIMING DATA TRANSFERS

BACKGROUND OF THE INVENTION

The present invention relates in general to digital timing circuits and, more particularly, to controlling the phase of a data transfer signal to set the proper timing for reading or writing to a data register.

Parallel-serial converters are commonly used in digital circuit design to convert multi-bit signals to a string of data bits that are serially transmitted one at a time. Serial-parallel converters in turn convert the string of data bits back to multi-bit signals. In both applications, a data register is typically embedded within an integrated circuit that periodically receives new data sourced by external logic, or sources new data for external logic. Timing generation logic for reading or writing the data register is also embedded within the integrated circuit. The timing generation logic asserts a periodic signal to the external logic requesting data be presented to or removed from the data register.

Many applications involve high speed operation, say in the gigahertz range. The data transaction must be completed within a predetermined time period. That is, write data must be present and valid for a setup time before, and hold time after it is loaded into the register by a clock signal. Likewise, read data must be present and valid for a setup time before, and hold time after it is read by external logic. Unfortunately at such high data rates, the propagation delay uncertainties of the external logic are almost as long as the entire transaction period.

When the periodic signal is asserted to the external logic, requesting that new data be read or written, the external logic begins the time-consuming process of retrieving or storing new data. In the case of a request from the IC to the external logic to write new data, when the external logic finally presents new data to the integrated circuit, the new data typically propagates through buffer logic and eventually reaches the data register. The internal timing generation logic asserts a clock signal to load the data register. When the data transaction is so fast that propagation delay uncertainties consume almost the entire time period, there is no assurance that data arrives at the data register within register setup and hold-time constraints.

Since the write data register and timing logic are embedded within the integrated circuit, it is difficult to directly measure the actual write setup and hold-time. That is, the setup and hold-time are not readily observable by the external logic. If the write data setup and hold-time are unknown, the data rate of the external sourcing logic must be reduced to ensure sufficient setup and hold-time. Otherwise, where the propagation time uncertainty consumes a large portion of the transaction time period, the data transaction may fail to correctly time the data transfer under a worst-case timing analysis.

Hence, a need exists to properly set the timing of requesting more write data or read data for the data register to achieve maximum data transfer.

DETAILED DESCRIPTION OF THE PREFERRED EMBODIMENT

Figure 1:
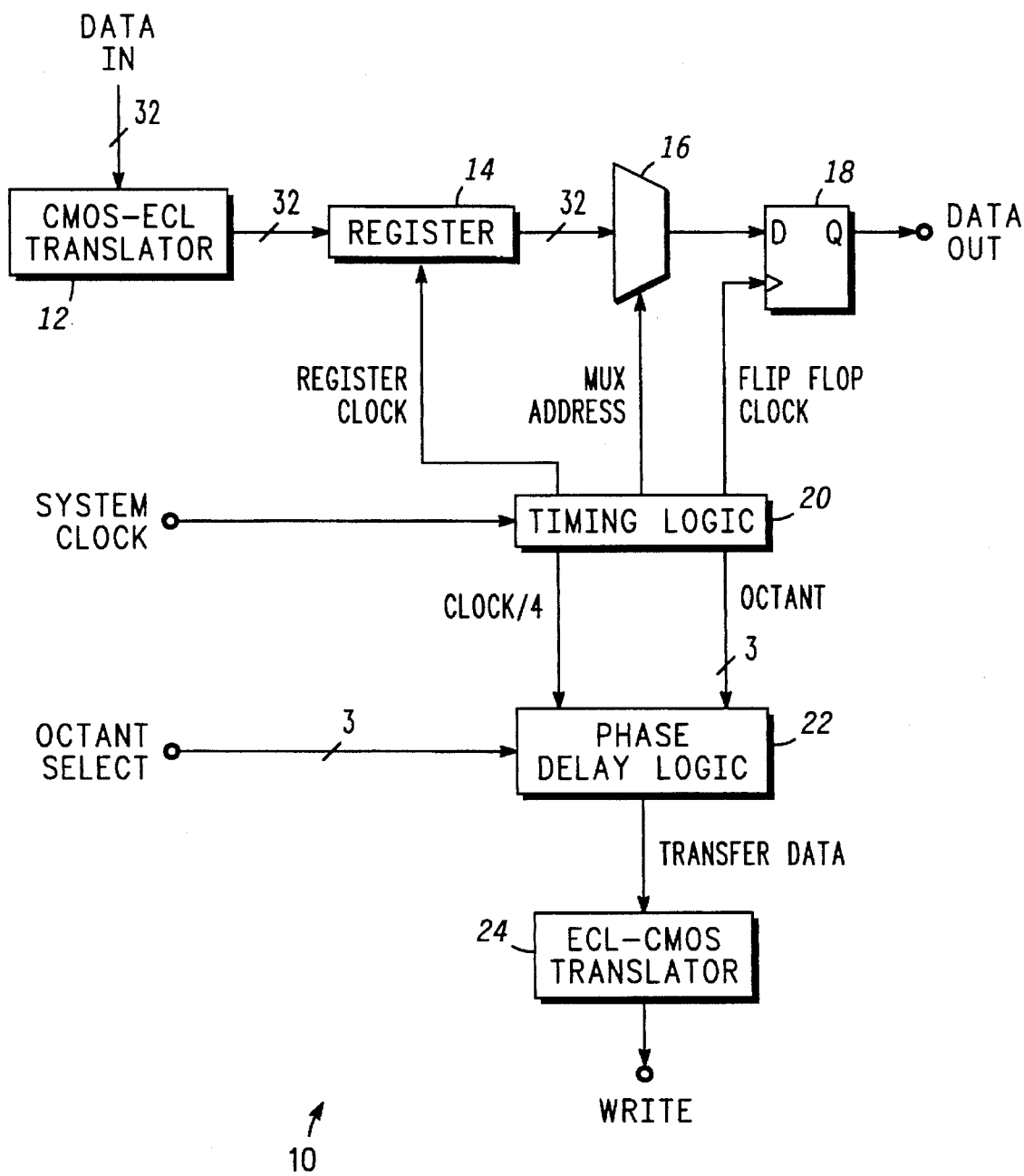
FIG. 1 is a block diagram illustrating a parallel-serial converter.

Referring to FIG. 1, a parallel-serial converter 10 is shown suitable for manufacturing as an integrated circuit using conventional integrated circuit processes. A CMOS-ECL voltage translator circuit 12 receives a 32-bit DATA IN word from external sourcing logic (not shown) operating at CMOS logic levels. CMOS-ECL voltage translator circuit 12 provides a 32-bit signal operating at ECL logic levels to 32-bit register 14. Register 14 loads data at rising edge of a REGISTER CLOCK signal. Multiplexer 16 rotates through the individual bit locations of register 14 under control of the MUX ADDRESS signal and provides serial bits to the data input of flipflop 18. Flipflop 18 transfers the serial data signal to DATA OUT at its Q-output upon receiving a FLIPFLOP CLOCK signal.

Timing logic 20 operates in response to a SYSTEM CLOCK signal, running for example at 2.5 gigahertz, for providing the FLIPFLOP CLOCK signal and the REGISTER CLOCK signal. The FLIPFLOP CLOCK signal operates in phase and at the same frequency as the SYSTEM CLOCK. The REGISTER CLOCK signal is derived from dividing the SYSTEM CLOCK by value thirty-two. The REGISTER CLOCK signal is aligned on the same rising edge as the SYSTEM CLOCK. The MUX ADDRESS is reset to zero with each REGISTER CLOCK and counts up with the SYSTEM CLOCK to value thirty-two. Thus, the serialized data stream DATA OUT is sent at the SYSTEM CLOCK frequency with the duration of each serial bit time the same as the period of the SYSTEM CLOCK.

Timing logic 20 further provides a CLOCK/4 signal and a 3-bit OCTANT signal. The CLOCK/4 signal is derived by dividing the SYSTEM CLOCK by value four with alignment on the rising edges of SYSTEM CLOCK. The OCTANT signal takes one of eight binary encoded values (0 through 7) as seen in Table 1. During a first group of four consecutive SYSTEM CLOCKS C0–C3, OCTANT has a value "000". During the second group of four consecutive SYSTEM CLOCKS C4–C7, OCTANT has a value "001", and so on. The OCTANT signal changes state at each rising edge of CLOCK/4, for example, by incrementing a counter (not shown). Timing logic 20 includes combinational logic to divide the SYSTEM CLOCK and reset the MUX ADDRESS signal. Such combinational logic can be implemented from the aforedescribed operations.

TABLE 1

| SYSTEM CLOCK | OCTANT |
|---|---|
| C0–C3 | "000" |
| C4–C7 | "001" |
| C8–C11 | "010" |
| C12–C15 | "011" |
| C16–C19 | "100" |
| C20–C23 | "101" |
| C24–C27 | "110" |
| C28–C31 | "111" |

Phase delay logic circuit 22 receives CLOCK/4 and OCTANT signals from timing logic 20, and an OCTANT SELECT signal from the external logic (not shown). ECL-CMOS translator 24 converts the TRANSFER DATA signal from phase delay logic circuit 22 to CMOS logic levels for the external logic. Upon receiving the WRITE control signal, the external logic sends the next 32-bit DATA IN word.

It is important for the overall circuit operation that the output signal from REGISTER 14 does not become metastable. The 32-bit data at the output of translator circuit 12 must be stable for a finite "setup time" before the rising edge of REGISTER CLOCK. Likewise, the 32-bit data must remain stable for a finite "hold-time" after the rising edge of REGISTER CLOCK to ensure that register 14 clocks in valid data. Any violation of setup and hold-time may cause the register output to become metastable, yielding indeterminate logic levels for an indeterminate time duration.

Accordingly, as a feature of the present invention, phase delay logic circuit 22 sets the timing of TRANSFER DATA signal by altering its phase as programmed by the 3-bit OCTANT SELECT signal to request more data at the proper time to allow parallel-serial converter 10 to complete processing the previous data. In practice during a calibration sequence, the OCTANT SELECT signal may be set to various values to determine proper delay time necessary before the WRITE is asserted so that the next DATA IN word arrives at the optimum time to ensure proper data set-up and hold times at the input of register 14 and to allow time to complete processing the previous data. Once the proper delay is determined by experimentation, phase delay logic circuit 22 asserts the TRANSFER DATA signal at the correct time by controlling its phase to allow maximum operating speed for parallel-serial converter 10 given the required set-up and hold-time of register 14.

Figure 2:
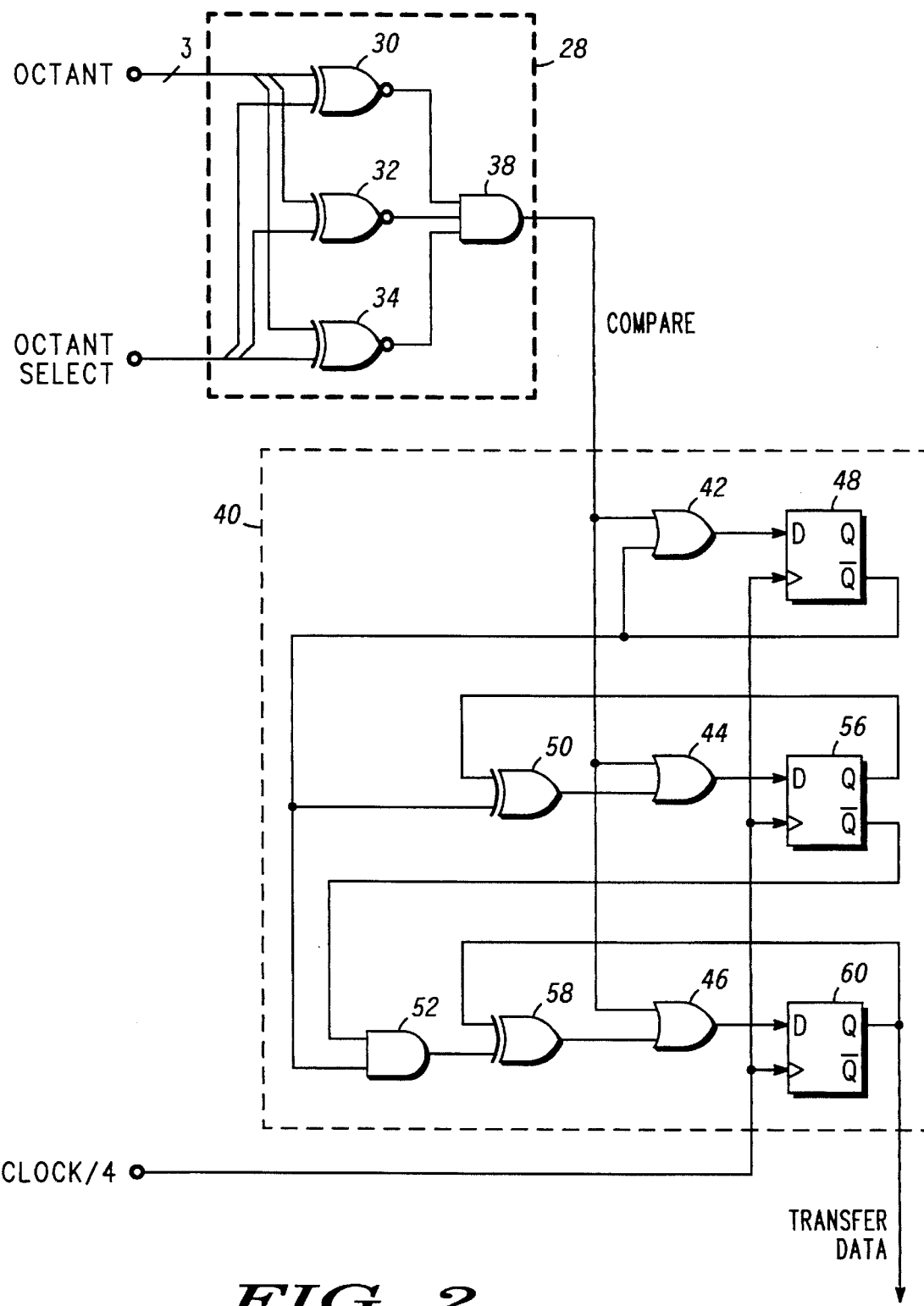
FIG. 2 is a schematic diagram illustrating the phase delay logic of FIG. 1.

Turning to FIG. 2, further detail of phase delay logic circuit 22 is shown including a digital comparator 28 implemented as exclusive-NOR (XNOR) gates 30, 32 and 34 and AND gate 38. XNOR gate 30 receives bit0 of the OCTANT signal and bit0 of the OCTANT SELECT signal. XNOR gate 32 receives bit1 of the OCTANT signal and bit1 of the OCTANT SELECT signal. XNOR gate 34 receives bit2 of the OCTANT signal and bit2 of the OCTANT SELECT signal. The outputs of XNOR gates 32–36 are coupled to inputs of AND gate 38. If the OCTANT signal matches the OCTANT SELECT signal, AND gate 38 receives all logic ones and provides a logic one COMPARE signal. Otherwise, the COMPARE signal from AND gate 38 is logic zero.

Logic block 40 provides a symmetric 50% duty cycle for the TRANSFER DATA signal by counting down after the COMPARE signal sets the TRANSFER DATA (most significant bit of three bit down-counter) to logic one. The COMPARE signal from AND gate 38 is applied to first inputs of OR gates 42, 44 and 46. The output of OR gate 42 is coupled to the D-input of flipflop 48. The $\overline{Q}$-output of flipflop 48 is coupled to the second input of OR gate 42, to an input of exclusive-OR (XOR) gate 50, and to an input of AND gate 52. The output of XOR gate 50 is coupled to a second input of OR gate 44 that in turn has an output coupled to the D-input of flipflop 56. The Q-output of flipflop 56 is coupled to the second input of XOR gate 50, while the $\overline{Q}$-output of flipflop 56 is coupled to the second input of AND gate 52. The output of AND gate 52 is coupled to a first input of XOR gate 58 that in turn has an output coupled to the second input of OR gate 46. The output of OR gate 46 is coupled to the D-input of flipflop 60. The Q-output of flipflop 60 is coupled to the second input of XOR gate 58 and further provides the TRANSFER DATA signal to ECL-CMOS translator 24 in FIG. 1. Flipflops 48, 56 and 60 receive the CLOCK/4 signal at their clock inputs.

During the 32-bit parallel to serial conversion, the 3-bit OCTANT signal increments on every rising edge of CLOCK/4, i.e. every four SYSTEM CLOCKS. When the 3-bit OCTANT signal matches the externally-supplied 3-bit OCTANT SELECT signal, the COMPARE signal is asserted as logic one. The Q-outputs of flipflops 48, 56 and 60 go to logic one on the next rising edge of the CLOCK/4 signal. The TRANSFER DATA signal goes to logic one. When the OCTANT signal increments to its next value and COMPARE returns to logic zero, flipflops 48, 56 and 60 operate as a 3-bit synchronous down counter and decrement with each rising edge of CLOCK/4. Since the TRANSFER DATA signal is the most significant bit of the down counter, it remains logic one for the first half of the counts and returns to logic zero for the second half of the counts. Logic block 40 thus provides a symmetric 50% duty cycle for the TRANSFER DATA signal.

For example, assume that the 32-bit DATA IN signal is latched into register 14 by the REGISTER CLOCK. In the present example, it has been determined by experimentation that the OCTANT SELECT signal "001" sets the proper phase delay before asserting TRANSFER DATA to the external logic to send the next DATA IN word. The delay determines the amount of time parallel-serial converter 10 needs to complete processing the present data word and be ready for the next. Assume that the Q-outputs of the flipflops begin at logic one and the $\overline{Q}$-outputs begin as logic zero. The first four SYSTEM CLOCKS C0–C3 correspond to multiplexer 16 reading the four least significant bits D0–D3 from register 14. At the first rising edge of CLOCK/4 (clock C0), the OCTANT signal is "000" and does not match the OCTANT SELECT signal "001". Consequently, the COMPARE signal is logic zero.

At the second rising edge of CLOCK/4 (clock C4), the OCTANT signal switches to "001" and matches the OCTANT SELECT signal causing the COMPARE signal goes to logic one. The outputs of OR gates 42–46 go to logic one due to the logic one COMPARE signal for the initial state of the down count. Four SYSTEM CLOCKS later, the third rising edge of CLOCK/4 (clock C8) clocks the logic ones into flipflops 48, 56 and 60 and sets their Q-outputs to logic one. The OCTANT signal switches to "010" and no longer matches the OCTANT SELECT signal. The COMPARE signal returns to logic zero. XOR gate 50 receives a logic zero from the $\overline{Q}$-output of flipflop 48 and a logic one from the Q-output of flipflop 56 and sets the second input of OR gate 44 to logic one. The D-input of flipflop 56 receives a logic one from OR gate 44. AND gate 52 receives logic zeroes from flipflops 48 and 56. XOR gate 58 receives a logic zero from AND gate 52 and a logic one from flipflop 60 and provides a logic one to OR gate 46. The D-input of flipflop 60 goes to logic one.

The fourth rising edge of CLOCK/4 (clock C12) sets the $\overline{Q}$-output of flipflop 48 to logic one while the Q-outputs of flipflops 56 and 60 remain logic one. The output of OR gate 42 goes to logic one. XOR gate 50 receives a logic one from the $\overline{Q}$-output of flipflop 48 and a logic one from the Q-output of flipflop 56 and sets the second input of OR gate 44 to logic zero. The D-input of flipflop 56 receives a logic zero from OR gate 44. AND gate 52 receives a logic one from flipflop 48 and a logic zero from flipflop 56. XOR gate 58 receives a logic zero from AND gate 52 and a logic one from flipflop 60 and provides a logic one to OR gate 46. The D-input of flipflop 60 goes to logic one.

The fifth rising edge of CLOCK/4 (clock C16) sets the Q-outputs of flipflops 48 and 60 to logic one while the Q-output of flipflop 56 goes to logic zero. The output of OR gate 42 goes to logic zero. XOR gate 50 receives logic zeroes from the $\overline{Q}$-output of flipflop 48 and the Q-output of flipflop 56 and sets the second input of OR gate 44 to logic zero. The D-input of flipflop 56 receives a logic zero from OR gate 44. AND gate 52 receives a logic zero from flipflop 48 and a logic one from flipflop 56. XOR gate 58 receives a logic zero from AND gate 52 and a logic one from flipflop 60 and provides a logic one to OR gate 46. The D-input of flipflop 60 goes to logic one.

The sixth rising edge of CLOCK/4 (clock C20) sets the $\overline{Q}$-outputs of flipflops 48 and 56 to logic one while the Q-output of flipflop 60 remains logic one. XOR gate 50 receives a logic one from the $\overline{Q}$-output of flipflop 48 and a logic zero from the Q-output of flipflop 56 and sets the second input of OR gate 44 to logic one. The D-input of flipflop 56 receives a logic one from OR gate 44. AND gate 52 receives logic ones from flipflops 48 and flipflop 56. XOR gate 58 receives a logic one from AND gate 52 and a logic one from flipflop 60 and provides a logic zero to OR gate 46. The D-input of flipflop 60 goes to logic zero.

The seventh rising edge of CLOCK/4 (clock C24) sets the TRANSFER DATA signal to logic zero. The TRANSFER DATA signal remains logic zero for the next four CLOCK/4 cycles, i.e. C24–C31 and C0–C7, as the down counter completes the second half of its count down sequence. Logic 40 thus provides a symmetric 50% duty cycle. Either edge of the TRANSFER DATA signal may be used to trigger the external logic to send more data to parallel-serial converter 10. By controlling the phase of TRANSFER DATA, the correct timing is established for data transfer so that the requested data arrives at the optimum time to maximize the operating speed of parallel-serial converter 10.

Figure 3:
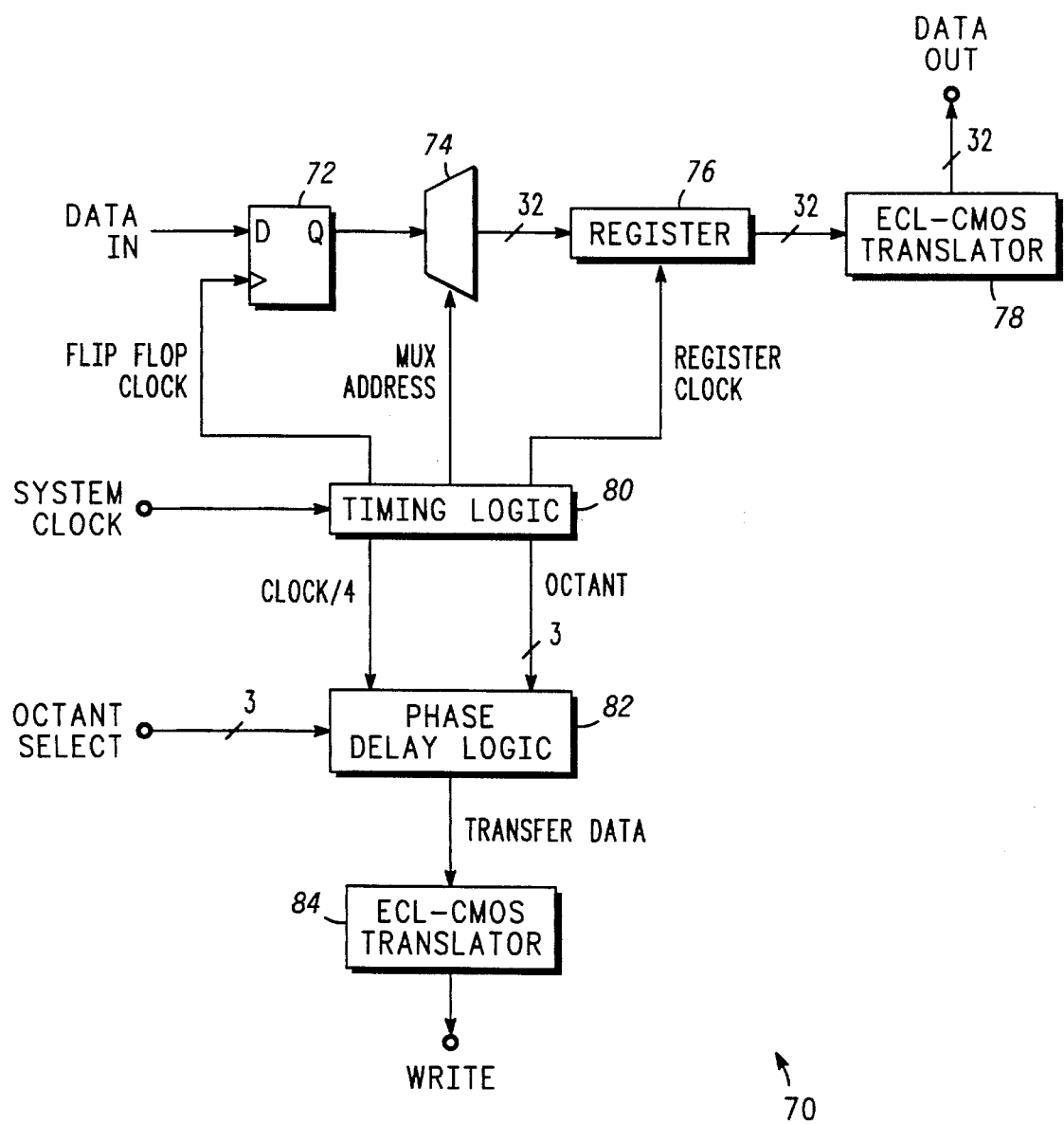
FIG. 3 is a block diagram illustrating a serial-parallel converter.

The aforedescribed phase control over the TRANSFER DATA is equally applicable to serial-parallel conversion such as shown in FIG. 3. Serial-parallel converter 70 is shown suitable for manufacturing as an integrated circuit using conventional integrated circuit processes. The data input of flipflop 72 receives the serial DATA IN signal from external sourcing logic (not shown) and passes it to multiplexer 74 at each FLIPFLOP CLOCK. Multiplexer 74 rotates through its individual bit locations under control of the MUX ADDRESS signal and provides parallel bits to register 76. Register 76 loads data at rising edge of a REGISTER CLOCK signal. A CMOS-ECL voltage translator circuit 78 converts the 32-bit data word from register 76 to CMOS logic levels.

Timing logic 80 operates in response to a SYSTEM CLOCK signal, operating for example at 2.5 gigahertz, for providing the FLIPFLOP CLOCK signal and the REGISTER CLOCK signal. The FLIPFLOP CLOCK signal operates in phase and at the same frequency as the SYSTEM CLOCK. The REGISTER CLOCK signal are derived from dividing the SYSTEM CLOCK by value thirty-two. The REGISTER CLOCK signal is aligned on the same rising edge as the SYSTEM CLOCK. The MUX ADDRESS is reset to zero with each REGISTER CLOCK and counts up with the SYSTEM CLOCK to value thirty-two. Thus, the serialized data stream DATA OUT is sent at the SYSTEM CLOCK frequency with the duration of each serial bit time the same as the period of the SYSTEM CLOCK. Timing logic 20 further provides a CLOCK/4 signal and a 3-bit OCTANT signal. The CLOCK/4 signal is derived by dividing the SYSTEM CLOCK by value four aligned with the rising edges of SYSTEM CLOCK. The OCTANT signal takes one of eight binary encoded values (0 through 7) as seen in Table 1. Timing logic 80 includes combinational logic to divide the SYSTEM CLOCK and reset the MUX ADDRESS signal. Such combinational logic can be implemented from the aforedescribed operations.

Phase delay logic circuit 82 receives CLOCK/4 and OCTANT signals from timing logic 80, and an OCTANT SELECT signal from external logic (not shown). ECL-CMOS translator 84 converts the TRANSFER DATA signal from phase delay logic circuit 82 to CMOS logic levels for the external logic. Upon receiving the WRITE control signal, the external logic sends the next DATA IN bit. Phase delay logic circuit 82 follows the same description given in FIG. 2 and asserts the TRANSFER DATA signal at the correct time to allow maximum operating speed for serial-parallel converter 70 given the required set-up and hold-time of register 76.

By now it should be appreciated that the present invention provides proper timing of the data transfer between external data sourcing or sinking logic and data conversion circuits. Phase delay logic sets the delay for a transfer data control signal as programmed by a select signal. During a calibration sequence, the select signal is set to various values to determine proper delay time necessary before requesting that more data be read or written. Once the proper delay is determined by experimentation, the phase delay logic circuit asserts the transfer data signal at the correct time by controlling its phase, to allow maximum operating speed for the data conversion given the required set-up and hold-time of the embedded register and of the external logic. By controlling the phase of transfer data requests, the correct timing is established to ensure proper data set-up and hold times and to allow complete processing before the next data word needs to be read or written.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. The present invention is applicable to other types of data processing circuits that must control timing of incoming data.

What is claimed is:

1. A phase delay circuit, comprising:

a comparator having first and second inputs and an output, said first input receiving a first control signal, said second input receiving a second control signal, said output providing a compare signal having a first state when said first and second control signals match; and a down counter responsive to said compare signal for initializing a count value and responsive to a clock signal for counting down to generate an output signal having a symmetric duty cycle.

2. The circuit of claim 1 wherein said down counter includes:

a first OR gate having first and second inputs and an output, said first input being coupled for receiving said compare signal; and a first flipflop having a data input, a clock input, and an inverted output, said data input being coupled to said output of said first OR gate, said inverted output being coupled to said second input of said first OR gate, said clock input being coupled for receiving said clock signal.

3. The circuit of claim 2 wherein said down counter further includes:

a first exclusive-OR gate having first and second inputs and an output, said first input being coupled to said inverted output of said first flipflop;

a second OR gate having first and second inputs and an output, said first input being coupled for receiving said compare signal, said second input being coupled to said output of said first exclusive-OR gate; and a second flipflop having a data input, a clock input, and first and second complementary outputs, said data input being coupled to said output of said second OR gate, said first complementary output being coupled to said second input of said first exclusive-OR gate, said clock input being coupled for receiving said clock signal.

4. The circuit of claim 3 wherein said down counter further includes:

a first AND gate having first and second inputs and an output, said first input being coupled to said inverted output of said first flipflop, said second input being coupled to said second complementary output of said second flipflop;

a second exclusive-OR gate having first and second inputs and an output, said first input being coupled to said output of said first AND gate;

a third OR gate having first and second inputs and an output, said first input being coupled for receiving said compare signal, said second input being coupled to said output of said second exclusive-OR gate; and a third flipflop having a data input, a clock input, and an output, said data input being coupled to said output of said third OR gate, said output being coupled to said second input of said second exclusive-OR gate and providing said output signal of said down counter, said clock input being coupled for receiving said clock signal.

5. The circuit of claim 4 wherein said comparator includes:

a third exclusive-OR gate having first and second inputs and an output, said first input being coupled for receiving a first bit of said first control signal, said second input being coupled for receiving a first bit of said second control signal;

a fourth exclusive-OR gate having first and second inputs and an output, said first input being coupled for receiving a second bit of said first control signal, said second input being coupled for receiving a second bit of said second control signal; and a second AND gate having first and second inputs and an output, said first input being coupled to said output of said third exclusive-OR gate, said second input being coupled to said output of said fourth exclusive-OR gate, said output providing said compare signal.

6. The circuit of claim 5 wherein said comparator further includes a fifth exclusive-OR gate having first and second inputs and an output, said first input being coupled for receiving a third bit of said first control signal, said second input being coupled for receiving a third bit of said second control signal, said output being coupled to a third input of said second AND gate.

7. A method of selecting phase delay of a transfer data control signal, comprising the steps of:

comparing first and second control signals and generating a compare signal having a first state when said first and second control signals match; and initializing a count value in response to said compare signal; and counting down said count value in response to a clock signal to provide a most significant bit of said count value with a symmetric duty cycle.

8. A data conversion circuit, comprising:

a register having an input coupled for receiving parallel input data and having an output;

a multiplexer having an input coupled to said output of said register for providing serial data;

a comparator having first and second inputs and an output, said first input receiving a first control signal, said second input receiving a second control signal, said output providing a compare signal having a first state when said first and second control signals match; and a down counter responsive to said compare signal for initializing a count value and responsive to a clock signal for counting down to generate a transfer data signal having a symmetric duty cycle to enable transfer of said parallel input data to said register.

9. The circuit of claim 8 wherein said down counter includes:

a first OR gate having first and second inputs and an output, said first input being coupled for receiving said compare signal; and a first flipflop having a data input, a clock input, and an inverted output, said data input being coupled to said output of said first OR gate, said inverted output being coupled to said second input of said first OR gate, said clock input being coupled for receiving said clock signal.

10. The circuit of claim 9 wherein said down counter further includes:

a first exclusive-OR gate having first and second inputs and an output, said first input being coupled to said inverted output of said first flipflop;

a second OR gate having first and second inputs and an output, said first input being coupled for receiving said compare signal, said second input being coupled to said output of said first exclusive-OR gate; and a second flipflop having a data input, a clock input, and first and second complementary outputs, said data input being coupled to said output of said second OR gate, said first complementary output being coupled to said second input of said first exclusive-OR gate, said clock input being coupled for receiving said clock signal.

11. The circuit of claim 10 wherein said down counter further includes:

a first AND gate having first and second inputs and an output, said first input being coupled to said inverted output of said first flipflop, said second input being coupled to said second complementary output of said second flipflop;

a second exclusive-OR gate having first and second inputs and an output, said first input being coupled to said output of said first AND gate;

a third OR gate having first and second inputs and an output, said first input being coupled for receiving said compare signal, said second input being coupled to said output of said second exclusive-OR gate; and a third flipflop having a data input, a clock input, and an output, said data input being coupled to said output of said third OR gate, said output being coupled to said second input of said second exclusive-OR gate and providing said output signal of said down counter, said clock input being coupled for receiving said clock signal.

12. The circuit of claim 11 wherein said comparator includes:

a third exclusive-OR gate having first and second inputs and an output, said first input being coupled for receiving a first bit of said first control signal, said second input being coupled for receiving a first bit of said second control signal;

a fourth exclusive-OR gate having first and second inputs and an output, said first input being coupled for receiving a second bit of said first control signal, said second input being coupled for receiving a second bit of said second control signal; and a second AND gate having first and second inputs and an output, said first input being coupled to said output of said third exclusive-OR gate, said second input being coupled to said output of said fourth exclusive-OR gate, said output providing said compare signal.

13. The circuit of claim 12 wherein said comparator further includes a fifth exclusive-OR gate having first and second inputs and an output, said first input being coupled for receiving a third bit of said first control signal, said second input being coupled for receiving a third bit of said second control signal, said output being coupled to a third input of said second AND gate.

14. A data conversion circuit, comprising:

a multiplexer having an input coupled for receiving serial input data and having an output;

a register having an input coupled to said output of said register for providing prarllel data;

a comparator having first and second inputs and an output, said first input receiving a first control signal, said second input receiving a second control signal, said output providing a compare signal having a first state when said first and second control signals match; and a down counter responsive to said compare signal for initializing a count value and responsive to a clock signal having a symmetric duty cycle to enable transfer of said serial input data to said register.

15. The circuit of claim 14 wherein said down counter includes:

a first OR gate having first and second inputs and an output, said first input being coupled for receiving said compare signal; and a first flipflop having a data input, a clock input, and an inverted output, said data input being coupled to said output of said first OR gate, said inverted output being coupled to said second input of said first OR gate, said clock input being coupled for receiving said clock signal.

16. The circuit of claim 15 wherein said down counter further includes:

a first exclusive-OR gate having first and second inputs and an output, said first input being coupled to said inverted output of said first flipflop;

a second OR gate having first and second inputs and an output, said first input being coupled for receiving said compare signal, said second input being coupled to said output of said first exclusive-OR gate; and a second flipflop having a data input, a clock input, and first and second complementary outputs, said data input being coupled to said output of said second OR gate, said first complementary output being coupled to said second input of said first exclusive-OR gate, said clock input being coupled for receiving said clock signal.

17. The circuit of claim 16 wherein said down counter further includes:

a first AND gate having first and second inputs and an output, said first input being coupled to said inverted output of said first flipflop, said second input being coupled to said second complementary output of said second flipflop;

a second exclusive-OR gate having first and second inputs and an output, said first input being coupled to said output of said first AND gate;

a third OR gate having first and second inputs and an output, said first input being coupled for receiving said compare signal, said second input being coupled to said output of said second exclusive-OR gate; and a third flipflop having a data input, a clock input, and an output, said data input being coupled to said output of said third OR gate, said output being coupled to said second input of said second exclusive-OR gate and providing said output signal of said down counter, said clock input being coupled for receiving said clock signal.

18. The circuit of claim 17 wherein said comparator includes:

a third exclusive-OR gate having first and second inputs and an output, said first input being coupled for receiving a first bit of said first control signal, said second input being coupled for receiving a first bit of said second control signal;

a fourth exclusive-OR gate having first and second inputs and an output, said first input being coupled for receiving a second bit of said first control signal, said second input being coupled for receiving a second bit of said second control signal; and a second AND gate having first and second inputs and an output, said first input being coupled to said output of said third exclusive-OR gate, said second input being coupled to said output of said fourth exclusive-OR gate, said output providing said compare signal.

19. The circuit of claim 18 wherein said comparator further includes a fifth exclusive-OR gate having first and second inputs and an output, said first input being coupled for receiving a third bit of said first control signal, said second input being coupled for receiving a third bit of said second control signal, said output being coupled to a third input of said second AND gate.

* * * * *

UNITED STATES PATENT AND TRADEMARK OFFICE
CERTIFICATE OF CORRECTION

PATENT NO. : 5,563,594
DATED : October 8, 1996
INVENTOR(S) : David K. Ford et al.

It is certified that error appears in the above-indentified patent and that said Letters Patent is hereby corrected as shown below:

In claim 14, column 9, line 30, insert --for counting down to generate a transfer data signal-- after "signal".

In claim 17, column 10, line 7, delete "16lwherein" and insert --16 wherein--.

Signed and Sealed this

Twenty-ninth Day of April, 1997

Attest:

Attesting Officer

BRUCE LEHMAN

Commissioner of Patents and Trademarks

UNITED STATES PATENT AND TRADEMARK OFFICE
CERTIFICATE OF CORRECTION

PATENT NO. : 5,563,594
DATED : October 8, 1996
INVENTOR(S) : David K. Ford and Bernard E. Weir, III It is certified that error appears in the above-identified patent and that said Letters Patent is hereby corrected as shown below:

Column 9,
Line 22, please change "prarllel" to -- parallel --.

Signed and Sealed this

Twenty-second Day of March, 2005

JON W. DUDAS
*Director of the United States Patent and Trademark Office*